(12) United States Patent
Kim et al.

(10) Patent No.: US 12,494,166 B1
(45) Date of Patent: Dec. 9, 2025

(54) DISPLAY DEVICE

(71) Applicant: LG Display Co., Ltd., Seoul (KR)

(72) Inventors: Jin-Hun Kim, Paju-si (KR); Ju-Hee Eun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/984,344

(22) Filed: Dec. 17, 2024

Related U.S. Application Data

(63) Continuation of application No. 18/514,799, filed on Nov. 20, 2023, now Pat. No. 12,205,538.

(30) Foreign Application Priority Data

Dec. 29, 2022 (KR) .................. 10-2022-0189905

(51) Int. Cl.
*G09G 3/30* (2006.01)
*G09G 3/3225* (2016.01)

(52) U.S. Cl.
CPC ... *G09G 3/3225* (2013.01); *G09G 2300/0426* (2013.01); *G09G 2300/0861* (2013.01); *G09G 2310/08* (2013.01); *G09G 2320/0209* (2013.01)

(58) Field of Classification Search
CPC .............. G09G 3/3266; G09G 2310/02–0216
See application file for complete search history.

(56) References Cited

U.S. PATENT DOCUMENTS

| 10,916,198 | B2 | 2/2021 | Lin et al. |
| 11,195,468 | B2 | 12/2021 | Park et al. |
| 11,282,462 | B2 | 3/2022 | Lin et al. |
| 11,538,415 | B2 | 12/2022 | Shin et al. |
| 11,651,736 | B2 | 5/2023 | Lin et al. |

(Continued)

FOREIGN PATENT DOCUMENTS

| EP | 4064264 A2 | 9/2022 |
| KR | 10-2020-0087711 A | 7/2020 |

(Continued)

OTHER PUBLICATIONS

Intellectual Property Office of the United Kingdom, Combined Search and Examination Report, United Kingdom Patent Application No. GB2318284.3, Jun. 3, 2024, 11 pages.

(Continued)

*Primary Examiner* — Sanghyuk Park
(74) *Attorney, Agent, or Firm* — Fenwick & West LLP

(57) ABSTRACT

A display device comprising a storage capacitor connected to a high level voltage line, a first transistor switched according to a voltage of a first capacitor electrode of the storage capacitor, a second transistor switched according to a gate2 signal and connected to a data signal and the first transistor, a third transistor switched according to a gate1 signal and connected to the storage capacitor and the first transistor, a fourth transistor switched according to the gate1 signal and connected to the storage capacitor and an initial voltage, a fifth transistor switched according to an emission signal and connected to the high level voltage and the first transistor, a sixth transistor switched according to the emission signal and connected to the first transistor, and a light emitting diode connected between the sixth transistor and a low level voltage line.

20 Claims, 6 Drawing Sheets

(56) References Cited

U.S. PATENT DOCUMENTS

| | | | |
|---|---|---|---|
| 2012/0262441 A1* | 10/2012 | Ochiai | G09G 3/3677 |
| | | | 345/212 |
| 2013/0009888 A1* | 1/2013 | Park | G06F 3/0421 |
| | | | 345/173 |
| 2019/0051250 A1 | 2/2019 | Lee | |
| 2020/0226978 A1 | 7/2020 | Lin et al. | |
| 2021/0020109 A1 | 1/2021 | Lin et al. | |
| 2021/0166635 A1* | 6/2021 | In | G09G 3/2014 |
| 2021/0265437 A1 | 8/2021 | Son et al. | |
| 2021/0280136 A1 | 9/2021 | Shin et al. | |
| 2021/0287605 A1 | 9/2021 | Wang et al. | |
| 2022/0148511 A1 | 5/2022 | Kim et al. | |
| 2022/0180812 A1 | 6/2022 | Lin et al. | |
| 2023/0237965 A1 | 7/2023 | Lin et al. | |
| 2024/0078971 A1 | 3/2024 | Han et al. | |

FOREIGN PATENT DOCUMENTS

| | | |
|---|---|---|
| KR | 10-2021-0086331 A | 7/2021 |
| WO | WO 2020/027403 A1 | 2/2020 |
| WO | WO 2022/226845 A1 | 11/2022 |

OTHER PUBLICATIONS

United States Office Action, U.S. Appl. No. 18/514,799, filed Jul. 5, 2024, 11 pages.

* cited by examiner

DISPLAY DEVICE

CROSS-REFERENCE TO RELATED APPLICATION

The present application is a continuation of U.S. patent application Ser. No. 18/514,799 filed on Nov. 20, 2023, which claims the priority benefit of Republic of Korea Patent Application No. 10-2022-0189905, filed on Dec. 29, 2022, each of which is hereby incorporated by reference in its entirety.

BACKGROUND

Technical Field

The present disclosure relates to a display device, and more particularly, to a display device where a crosstalk is improved by adjusting a timing of a gate signal.

Discussion of the Related Art

Recently, with the advent of an information-oriented society, the interest in information displays for processing and displaying a massive amount of information and the demand for portable information media have increased. As such, a display field has rapidly advanced. Thus, various light and thin flat panel display devices have been developed and highlighted.

Among the various flat panel display devices, an organic light emitting diode (OLED) display device is an emissive type device that does not include a backlight unit used in a non-emissive type device such as a liquid crystal display (LCD) device. As a result, the OLED display device has advantages in a viewing angle, a contrast ratio and a power consumption to be applied to various fields.

The OLED display device uses a plurality of gate signals, and some of the plurality of gate signals distorts a data signal due to a coupling between the gate signals and the data signal. As a result, a slanted line crosstalk along a diagonal direction may be caused and a display quality of an image may be deteriorated.

SUMMARY

Accordingly, the present disclosure is directed to a display device that substantially obviates one or more of the problems due to limitations and disadvantages of the related art.

An object of the present disclosure is to provide an organic light emitting diode display device where a slanted line crosstalk along a diagonal direction is reduced or minimized by adjusting a timing of a gate signal.

Another object of the present disclosure is to provide an organic light emitting diode display device where a distortion of a data signal and a slanted line crosstalk along a diagonal direction are reduced or minimized and a display quality of an image is improved by performing a sampling after a data signal is saturated.

Additional features and advantages of the disclosure will be set forth in the description which follows, and in part will be apparent from the description, or can be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes: a timing controlling circuit configured to generate image data, a data control signal, and a gate control signal; a data driving circuit configured to generate a data signal using the image data and the data control signal; a gate driving circuit configured to generate a gate1 signal, an odd gate2 signal, an even gate2 signal, and an emission signal using the gate control signal; and a display panel displaying an image using the gate1 signal, the odd gate2 signal, the even gate2 signal, and the emission signal, wherein a rising timing of the gate1 signal during which the gate1 signal rises from a low level to high level occurs while a rising timing of the odd gate2 signal during which the odd gate2 signal rises from the low level to the high level occurs or the rising timing of the gate1 signal occurs after the rising timing of the odd gate2 signal.

In one embodiment, a display device comprises: a display panel including a plurality of pixel lines arranged in even pixel lines and odd pixel lines, a plurality of gate lines connected to a plurality of pixels included in the plurality of pixel lines, and a plurality of data lines connected to the plurality of pixels; a data driving circuit configured to provide a data signal corresponding to image data to the plurality of data lines; a gate driving circuit configured to generate a first gate signal that is applied to the even pixel lines and the odd pixel lines and an odd gate signal that is applied to the odd pixel lines but not the even pixel lines, wherein the first gate signal is applied to a first pixel line from the plurality of pixel lines and rises from a first level to a second level while the odd gate signal that is applied to an odd pixel line that is arranged prior to the first pixel line rises from the first level to the second level or the first gate signal rises from the first level to the second level after the odd gate signal rises from the first level to the second level.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
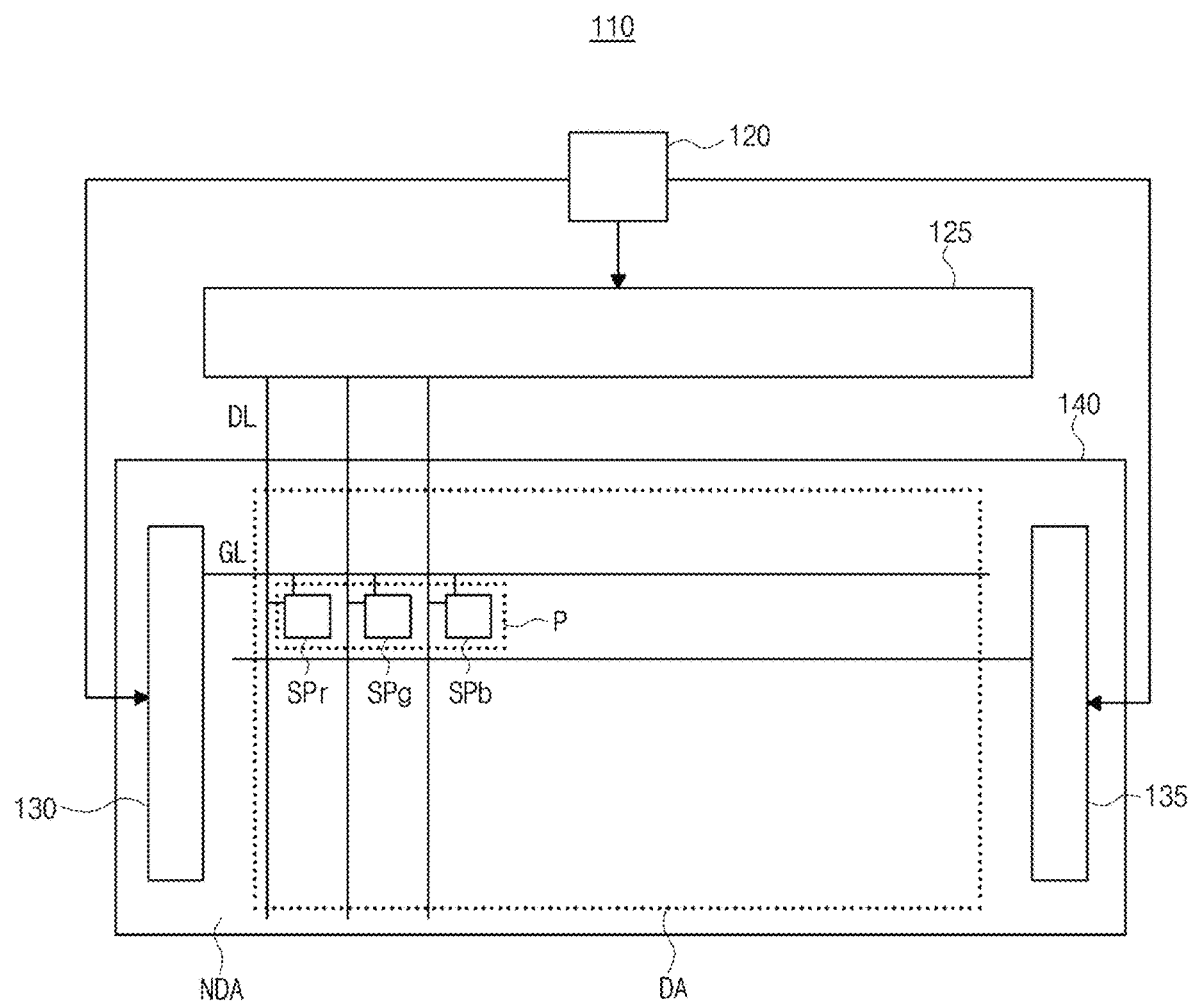
FIG. 1 is a view showing a display device according to an embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the present disclosure is only defined by scopes of claims.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals refer to like elements throughout the specification, unless otherwise specified.

In the following description, where the detailed description of the relevant known function or configuration may unnecessarily obscure a feature or aspect of the present disclosure, a detailed description of such known function or configuration may be omitted or a brief description may be provided.

Where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or a tolerance range even where no explicit description of such an error or tolerance range is provided.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

Although the terms "first," "second," A, B, (a), (b), and the like may be used herein to refer to various elements, these elements should not be interpreted to be limited by these terms as they are not used to define a particular order or precedence. These terms are only used to distinguish one element from another. For example, a first element could be termed a second element, and, similarly, a second element could be termed a first element, without departing from the scope of the present disclosure.

The term "at least one" should be understood to include all combinations of one or more of related elements. For example, the term of "at least one of first, second and third elements" may include all combinations of two or more of the first, second and third elements as well as the first, second or third element.

The term "display device" may include a display device in a narrow sense such as liquid crystal module (LCM), an organic light emitting diode (OLED) module and a quantum dot (QD) module including a display panel and a driving unit for driving the display panel. In addition, the term "display device" may include a complete product (or a final product) including the LCM, the OLED module and the QD module such as a notebook computer, a television, a computer monitor, an equipment display device including an automotive display apparatus or a shape other than a vehicle, and a set electronic apparatus or a set device (or a set apparatus) such as a mobile electronic apparatus of a smart phone or an electronic pad. The terms 'rising timing' and 'falling timing' can be considered to be 'rising edge' and 'falling edge' respectively. The terms 'rising start timing' and 'rising end timing' can be considered to be 'rising edge start' and 'rising edge end' respectively.

Accordingly, a display device of the present disclosure may include an applied product or a set device of a final user's device including the LCM, the OLED module and the QD module as well as a display device in a narrow sense such as the LCM, the OLED module and the QD module.

According to circumstances, the LCM, the OLED module and the QD module having a display panel and a driving unit may be expressed as "a display device", and an electronic apparatus of a complete product including the LCM, the OLED module and the QD module may be expressed as "a set device." For example, a display device in a narrow sense may include a display panel of a liquid crystal, an organic light emitting diode and a quantum dot and a source printed circuit board (PCB) of a control unit for driving the display panel, and a set device may further include a set PCB of a set control unit electrically connected to the source PCB for controlling the entire set device.

The display panel of the present disclosure may include all kinds of display panels such as a liquid crystal display panel, an organic light emitting diode display panel, a quantum dot display panel and an electroluminescent display panel. The display panel of the present disclosure is not limited to a specific display panel of a bezel bending having a flexible substrate for an organic light emitting diode display panel and a lower back plate supporter. A shape or a size of the display panel for the display device of the present disclosure is not limited thereto.

For example, when the display panel is an organic light emitting diode display panel, the display panel may include a plurality of gate lines, a plurality of data lines and a subpixel in a crossing region of the plurality of gate lines and the plurality of data lines. The display panel may include an array having a thin film transistor of an element for selectively applying a voltage to each subpixel, an emitting element layer on the array and an encapsulating substrate or an encapsulation part covering the emitting element layer. The encapsulation part may protect the thin film transistor and the emitting element layer from an external impact and may prevent or at least reduce penetration of a moisture or an oxygen into the emitting element layer. In addition, a layer on the array may include an inorganic light emitting layer, for example, a nano-sized material layer or a quantum dot.

The thin film transistor of the present disclosure may include one of an oxide thin film transistor, an amorphous silicon thin film transistor, a low temperature polycrystalline silicon thin film transistor.

Features of various embodiments of the present disclosure may be partially or entirely coupled to or combined with each other. They may be linked and operated technically in various ways as those skilled in the art can sufficiently understand. The embodiments may be carried out independently of or in association with each other in various combinations.

Hereinafter, a display device according to various example embodiments of the present disclosure where an influence on an oxide semiconductor layer of a thin film transistor of a driving element part is reduced by shielding a light emitted and transmitted from a subpixel and/or a light inputted from an exterior will be described in detail with reference to the accompanying drawings.

FIG. 1 is a view showing a display device according to an embodiment of the present disclosure. The display device may be an organic light emitting diode (OLED) display device, for example.

In FIG. 1, a display device 110 according to an embodiment of the present disclosure includes a timing controlling unit 120, a data driving unit 125, a first gate driving unit 130, a second gate driving unit 135, and a display panel 140.

The timing controlling unit 120 (e.g., a timing controlling circuit or a timing controller) generates image data, a data control signal, and a gate control signal using an image signal and a plurality of timing signals including a data enable signal, a horizontal synchronization signal, a vertical synchronization signal and a clock signal transmitted from an external system such as a graphic card or a television system. The image data and the data control signal are transmitted to the data driving unit 125, and the gate control signal is transmitted to the first and second gate driving units 130 and 135.

The data driving unit 125 (e.g., a data driving circuit or a data driver) generates a data signal (e.g., a data voltage) Vdata (of FIG. 4) using the data control signal and the image data transmitted from the timing controlling unit 120 and transmits the data signal to a data line DL of the display panel 140.

The first gate driving unit 130 (e.g., a first gate driving circuit or a first gate driver) and the second gate driving unit 135 (e.g., a second gate driving circuit or a second gate driver) respectively generate a gate signal (a gate voltage) Sc1 and a gate signal Sc2 (of FIG. 4) and an emission signal (an emission voltage) Em (of FIG. 4) using the gate control signal transmitted from the timing controlling unit 120 and apply the gate signals Sc1 and Sc2 and the emission signal Em to a gate line GL of the display panel 140.

The first and second gate driving units 130 and 135 may have a gate in panel (GIP) type to be formed in a non-display area NDA of a substrate of the display panel 140 having the gate line GL, the data line DL and a pixel P. For example, the first gate driving unit 130 is in a first side of the display panel 140 and the second gate driving unit 135 is in a second side of the display panel that is opposite the first side.

Although the first and second gate driving units 130 and 135 are disposed in both side portions of the display panel 140 in the embodiment of FIG. 1, one gate driving unit may be disposed in one side portion of the display panel 140 in another embodiment.

The display panel 140 includes a display area DA at a central portion thereof and a non-display area NDA surrounding the display area DA. The display panel 140 displays an image using the gate signal Sc1 and Sc2, the emission signal Em and the data signal Vdata. For displaying an image, the display panel 140 includes a plurality of pixels P, a plurality of gate lines GL and a plurality of data lines DL in the display area DA.

Each of the plurality of pixels P includes red, green, and blue subpixels SPr, SPg and SPb, and the gate line GL and the data line DL cross each other to define the red, green and blue subpixels SPr, SPg and SPb. Each of the red, green and blue subpixels SPr, SPg and SPb is connected to the gate line GL and one of the data lines DL.

When the display device 110 is an OLED display device, each of the red, green and blue subpixels SPr, SPg and SPb may include a plurality of transistors such as a switching transistor, a driving transistor and a sensing transistor, a storage capacitor and a light emitting diode.

The display device 110 where a link line may be disposed in the display area for reducing a bezel will be illustrated with reference to a drawing.

Figure 2:
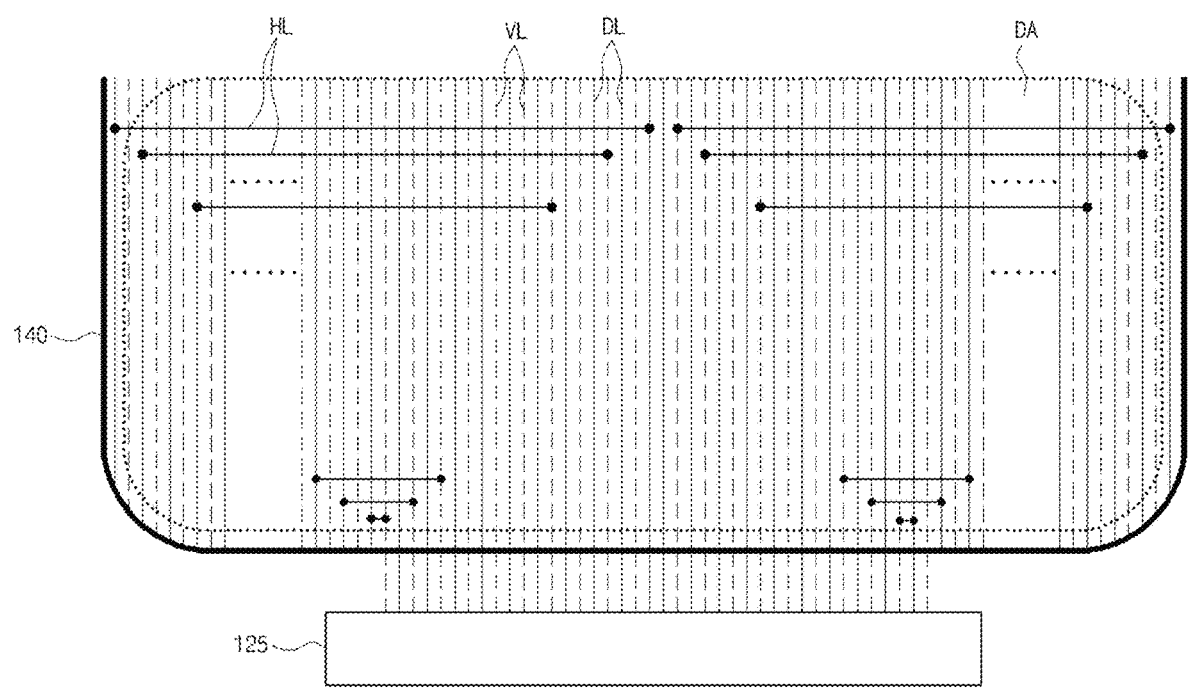
FIG. 2 is a plan view showing a display panel of a display device according to an embodiment of the present disclosure.

FIG. 2 is a plan view showing a display panel of a display device according to an embodiment of the present disclosure.

In FIG. 2, the display panel 140 of the display device 110 includes a plurality of vertical link lines VL (dashed vertical lines in FIG. 2) and a plurality of horizontal link lines HL disposed in the display area DA adjacent to the data driving unit 125.

The plurality of vertical link lines VL are disposed to be parallel to the plurality of data lines DL (solid vertical lines in FIG. 2) and are spaced apart from the plurality of data lines DL. The plurality of horizontal link lines HL are disposed to cross the plurality of data lines DL and are spaced apart from each other.

Some of the plurality of data lines DL and some of the plurality of vertical link lines VL are connected to the data driving unit 125 to receive the data signal Vdata. The plurality of horizontal link lines HL connect the vertical link line VL connected to the data driving unit 125 and the data line DL that is not connected to the data driving unit 125 to supply the data signal to all of the data lines.

A structure and an operation of the subpixel SP and the gate driving units 130 and 135 of the display device 110 will be illustrated with reference to a drawing.

Figure 3:
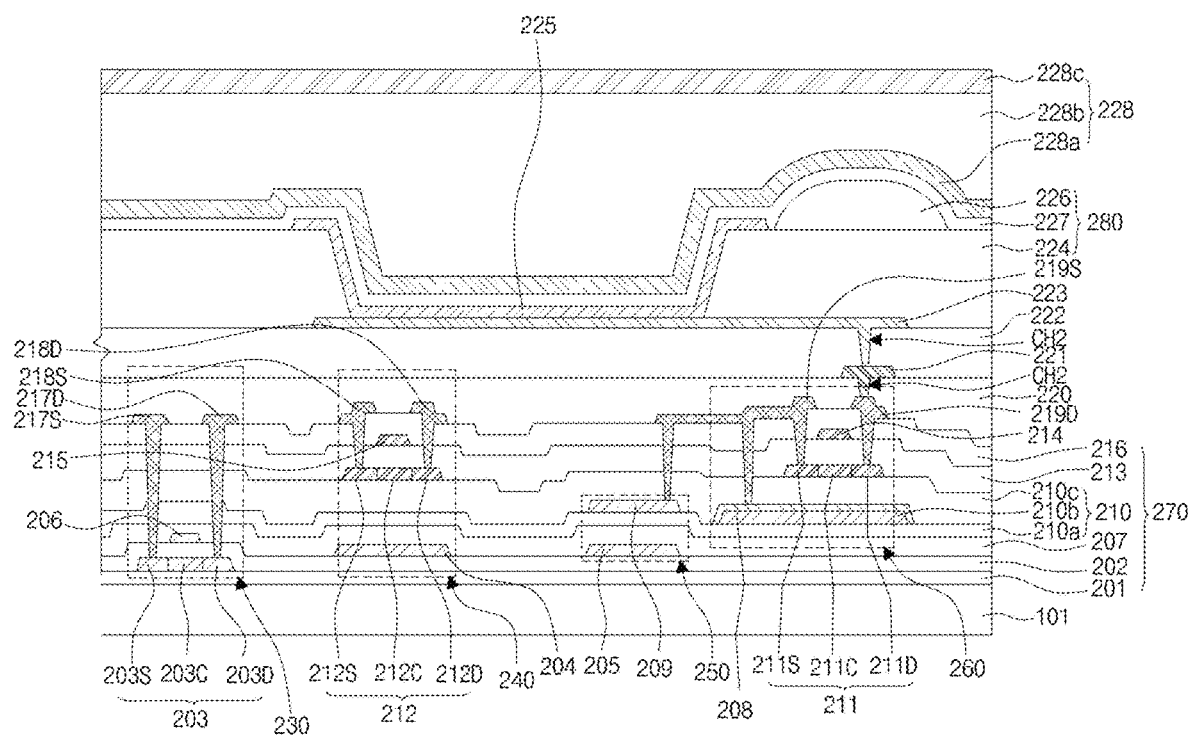
FIG. 3 is a cross-sectional view showing a display panel of a display device according to an embodiment of the present disclosure.
Figure 4:
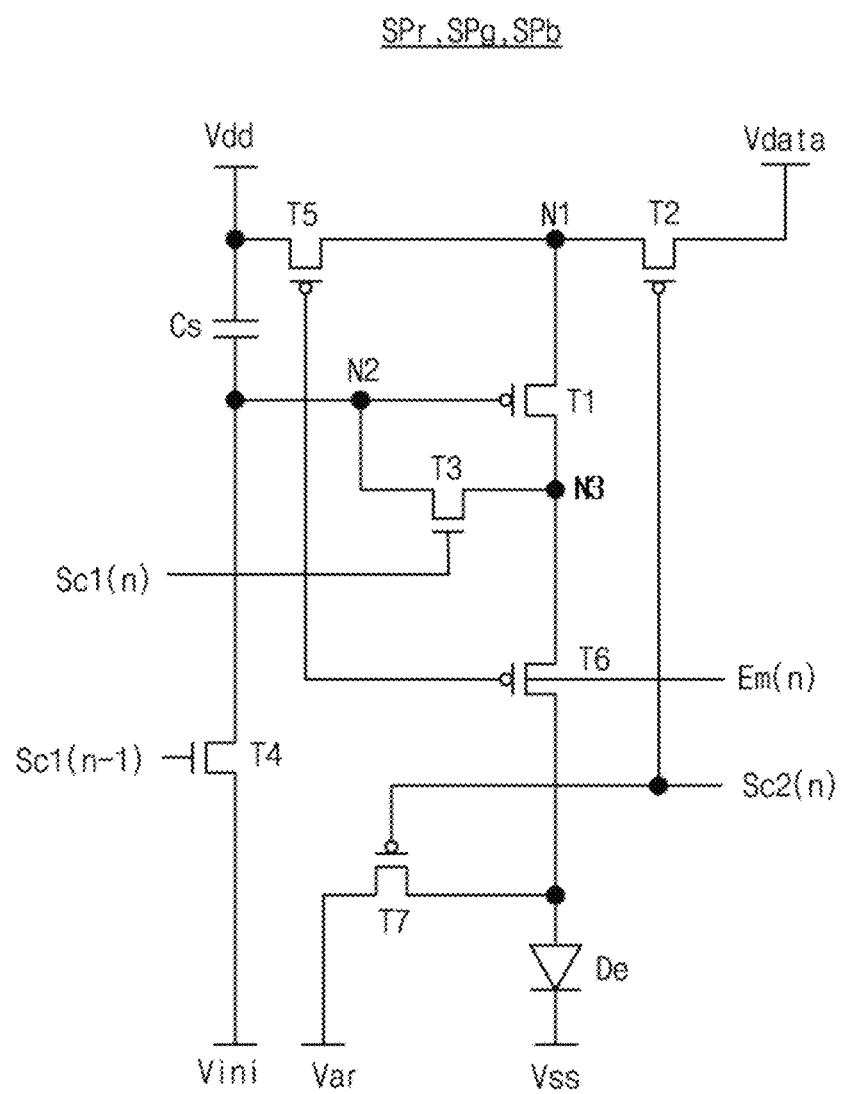
FIG. 4 is a circuit diagram showing a subpixel of a display device according to an embodiment of the present disclosure.
Figure 5:
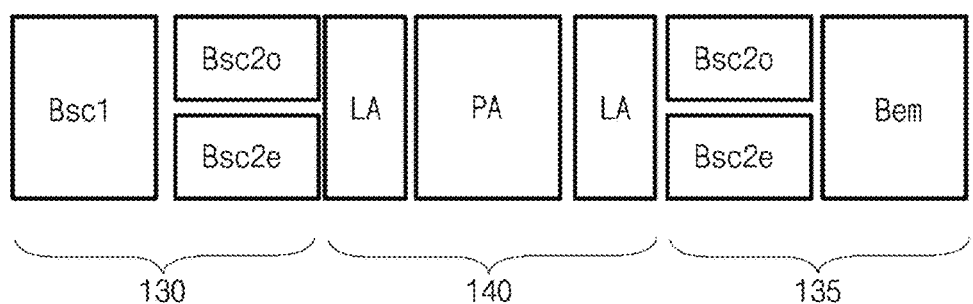
FIG. 5 is a block diagram showing first and second gate driving units and a display panel of a display device according to an embodiment of the present disclosure.

FIG. 3 is a cross-sectional view showing a display panel of a display device according to an embodiment of the present disclosure, FIG. 4 is a circuit diagram showing a subpixel of a display device according to an embodiment of the present disclosure, and FIG. 5 is a block diagram showing first and second gate driving units and a display panel of a display device according to an embodiment of the present disclosure.

In FIG. 3, the display panel 140 of the display device 110 according to an embodiment of the present disclosure includes one driving transistor 260, a plurality of switching transistors 230 and 240, and a storage capacitor 250.

A driving element 270 and an emitting element 280 electrically connected to the driving element 270 are disposed in each of the subpixels SPr, SPg and SPb on a substrate 101. The driving element 270 and the emitting element 280 are insulated from each other by planarizing layers 220 and 222.

The driving element 270 may be an array part including the driving transistor 260, the switching transistors 230 and 240, and the storage capacitor 250 and driving each of the subpixels SPr, SPg and SPb. The emitting element 280 may be an array part for light emission including an anode 223, a cathode 227, and an emitting layer 225 between the anode 223 and the cathode 227. The driving element 270 may be a first array part, and the emitting element 280 may be a second array part. The term 'array part' would be understood as the above by the skilled person.

Although one driving transistor 260, two switching transistors 230a and 240 and one storage capacitor 250 are shown in the embodiment of FIG. 3, it is not limited thereto.

The driving transistor 260 and the at least one switching transistor use an oxide semiconductor layer as an active layer. The oxide semiconductor layer formed of an oxide semiconductor material has an excellent effect of blocking a leakage current and has a relatively low fabrication cost as compared with a polycrystalline silicon layer. For example, the oxide semiconductor layer may include indium gallium zinc oxide (IGZO), zinc oxide (ZnO), tin oxide (SnO2), copper oxide (Cu2O), nickel oxide (NiO), indium tin zinc oxide (ITZO) and/or indium aluminum zinc oxide (IAZO). The embodiments of the present disclosure are not limited thereto. In the embodiment of the present disclosure, to reduce a power consumption and a fabrication cost, the driving transistor 260 and the at least one switching transistor may be fabricated using an oxide semiconductor layer.

A transistor using a polycrystalline semiconductor layer including a polycrystalline semiconductor material, for example, polycrystalline silicon (poly-Si) has a relatively high operation speed and an excellent reliability. In the embodiment of FIG. 3, one of the switching transistors may include a polycrystalline semiconductor layer and the others of the switching transistors may include an oxide semiconductor layer.

At least one of one driving transistor 260 and two switching transistors 230 and 240 is a positive (P) type transistor and the others of one driving transistor 260 and two switching transistors 230 and 240 are a negative (N) type transistor. For example, the driving transistor 260 may have a P type, and the transistor having an oxide semiconductor layer of two switching transistors 230 and 240 may have a N type.

The substrate 101 may have a multiple layer where at least one organic layer and at least one inorganic layer are alternately laminated. For example, the substrate 101 may have an organic layer including an organic material such as polyimide and an inorganic layer including an inorganic material such as silicon oxide (SiOx) alternately laminated with each other.

A lower buffer layer 201 may be disposed on the substrate 101. The lower buffer layer 201 may block permeation, for example by a moisture. The lower buffer layer 201 may have a multiple layer of silicon oxide (SiOx). A second buffer layer may be further disposed on the lower buffer layer 201 for protection from a moisture.

A first switching transistor 230 (one of second to seventh transistors T2 to T7 (of FIG. 4)) may be disposed on the lower buffer layer 201. The first switching transistor 230 may use a polycrystalline semiconductor layer as an active layer. The first switching transistor 230 may include a first active layer 203 having a channel where an electron or a hole moves, a first gate electrode 206, a first source electrode 217S and a first drain electrode 217D.

The first active layer 203 may include a polycrystalline semiconductor material. The first active layer 203 may include a first channel region 203C and a first source region 203S and a first drain region 203D at both sides of the first channel region 203C.

The first source region 203S and the first drain region 203D may include a conductorized region by doping an intrinsic polycrystalline semiconductor pattern with an impurity of a V group or a III group, for example, phosphorus (P) or boron (B). The first channel region 203C where the polycrystalline semiconductor material is kept as an intrinsic state may provide a moving path for an electron or a hole.

The first switching transistor 230 may include a first gate electrode 206 overlapping the first channel region 203C of the first active layer 203. A first gate insulating layer 202 may be disposed between the first gate electrode 206 and the first active layer 203.

The first switching transistor 230 may have a top gate type where the first gate electrode 206 is disposed over the first active layer 203. A first capacitor electrode 205 of the storage capacitor 250 and a second light shielding layer 204 of the second switching transistor 240 may be formed of a same material as the first gate electrode 206 through one mask process. As a result, a number of the mask processes may be reduced.

The first gate electrode 206 may include a metallic material. For example, the first gate electrode 206 may have a single layer or a multiple layer of one of molybdenum (Mo), aluminum (Al), chromium (Cr), gold (Au), titanium (Ti), nickel (Ni), neodymium (Nd), copper (Cu) and an alloy thereof.

A first interlayer insulating layer 207 may be disposed on the first gate electrode 206. The first interlayer insulating layer 207 may include silicon nitride (SiNx). The first interlayer insulating layer 207 of silicon nitride (SiNx) may have a hydrogen particle. When a heat treatment process is performed after the first active layer 203 is formed and the first interlayer insulating layer 207 is formed on the first active layer 203, the hydrogen particle of the first interlayer insulating layer 207 penetrates into the first source region 203S and the first drain region 203D to improve and stabilize a conductivity of the polycrystalline semiconductor material. The above process may be referred to as a hydrogenation process.

The first switching transistor 230 may further include an upper buffer layer 210, a second gate insulating layer 213 and a second interlayer insulating layer 216 sequentially on the first interlayer insulating layer 207. The first switching transistor 230 may be disposed on the second interlayer insulating layer 216 and may include a first source electrode 217S and a first drain electrode 217D connected to the first source region 203S and the first drain region 203D, respectively.

The upper buffer layer 210 may separate the first active layer 203 including a polycrystalline semiconductor material, the second active layer 212 of the second switching transistor 240 including an oxide semiconductor material and the third active layer 211 of the driving transistor 260 including an oxide semiconductor material. The upper buffer layer 210 may provide a base for the second active layer 212 and the third active layer 211.

A second interlayer insulating layer 216 may be disposed on the second gate electrode 215 of the second switching transistor 240 and the third gate electrode 214 of the driving transistor 260. Since the second interlayer insulating layer 216 is disposed on the second active layer 212 and the third active layer 211 including an oxide semiconductor material, the second interlayer insulating layer 216 may include an inorganic material without a hydrogen particle.

The first source electrode 217S and the first drain electrode 217D may have a single layer or a multiple layer of one of molybdenum (Mo), aluminum (Al), chromium (Cr), gold (Au), titanium (Ti), nickel (Ni), neodymium (Nd), copper (Cu) and an alloy thereof.

The second switching transistor 240 (another of second to seventh transistors T2 to T7 (of FIG. 4)) may be disposed on the upper buffer layer 210 and may include the second active layer 212 including an oxide semiconductor material, the second gate insulating layer 213 covering the second active layer 212, the second gate electrode 215 on the second gate insulating layer 213, the second interlayer insulating layer 216 covering the second gate electrode 215, and the second source electrode 218S and the second drain electrode 218D on the second interlayer insulating layer 216.

The second switching transistor 240 may further include a second light shielding layer 204 disposed under the upper buffer layer 210 and overlapping the second active layer 212. The second light shielding layer 204 may include the same material as the first gate electrode 206 and may be disposed on the first gate insulating layer 202.

The second light shielding layer 204 may be electrically connected to the second gate electrode 215 to constitute a dual gate. When the second switching transistor 240 has a dual gate structure, a current flow through a second channel region 212C may be more accurately controlled. Further, since a display device is formed to have a smaller size, a display device of a relatively high resolution may be obtained. More accurate control of current flow through the second channel region 212C is provided by the second switching transistor having a dual gate structure because the current flows through upper and lower portions of the second channel region 212C by the second gate electrode 215 and the second light shielding layer 204. With the dual gate structure, as the current is controlled by two gate electrodes, the current flow is more accurately controlled compared with a single gate structure.

The second active layer 212 may include an oxide semiconductor material and may have a second channel region 212C, a second source region 212S and a second drain region 212D. The second channel region may have an intrinsic state not doped with an impurity, and the second source region 212S and the second drain region 212D may have a conductorization state doped with an impurity.

The second source electrode 218S and the second drain electrode 218D may have a single layer or a multiple layer of one of molybdenum (Mo), aluminum (Al), chromium (Cr), gold (Au), titanium (Ti), nickel (Ni), neodymium (Nd), copper (Cu) and an alloy thereof.

The second source electrode 218S, the second drain electrode 218D, the first source electrode 217S and the first drain electrode 217D may be simultaneously formed on the second interlayer insulating layer 216 with the same material. As a result, a number of the mask processes may be reduced.

The third source electrode 219S and the third drain electrode 219D may be simultaneously formed with the second source electrode 218S, the second drain electrode 218D, the first source electrode 217S and the first drain electrode 217D on the second interlayer insulating layer 216 with the same material. As a result, a number of the mask processes may be reduced.

The driving transistor 260 (a first transistor T1 (of FIG. 4)) may be disposed on the upper buffer layer 210.

The driving transistor 260 may include a third active layer 211 including an oxide semiconductor material on the upper buffer layer 210, a second gate insulating layer 213 covering the third active layer 211, a third gate electrode 214 disposed on the second gate insulating layer 213 and overlapping the third active layer 211, the second interlayer insulating layer 216 covering the third gate electrode 214 and a third source electrode 219S and a third drain electrode 219D on the second interlayer insulating layer 216.

The driving transistor 260 may further include a first light shielding layer 208 disposed in the upper buffer layer 210 and overlapping the third active layer 211. The first light shielding layer 208 may be formed to be inserted (or accommodated) into the upper buffer layer 210.

For a structure where the first light shielding layer 208 is disposed in the upper buffer layer 210, the first light shielding layer 208 may be disposed on a first upper sub-buffer layer 210a over the first interlayer insulating layer 207. A second upper sub-buffer layer 210b may be disposed on the first light shielding layer 208 to cover the first light shielding layer 208 completely, and a third upper sub-buffer layer 210c may be disposed on the second upper sub-buffer layer 210b. For example, the upper buffer layer 210 may have a structure where the first upper sub-buffer layer 210a, the second upper sub-buffer layer 210b and the third upper sub-buffer layer 210c are sequentially laminated.

The first upper sub-buffer layer 210a and the third upper sub-buffer layer 210c may include silicon oxide (SiOx). When the first upper sub-buffer layer 210a and the third upper sub-buffer layer 210c include silicon oxide (SiOx) without a hydrogen particle, the first upper sub-buffer layer 210a and the third upper sub-buffer layer 210c may be provided as a base for the second switching transistor 240 and the driving transistor 260 using an oxide semiconductor material susceptible to a hydrogen particle for an active layer.

The second upper sub-buffer layer 210b may include silicon nitride (SiNx) having an excellent capturing ability for a hydrogen particle. The second upper sub-buffer layer 210b may surround a top surface and a side surface of the first light shielding layer 208 to seal the first light shielding layer 208 completely.

A hydrogen particle generated in a hydrogenation process of the first switching transistor 230 using a polycrystalline semiconductor material for an active layer may pass through the upper buffer layer 210 to deteriorate a reliability of an oxide semiconductor material on the upper buffer layer 210. For example, when a hydrogen particle penetrates into an oxide semiconductor material, a transistor including an oxide semiconductor material may have different threshold voltages or may have different conductivities of a channel according to a position where the oxide semiconductor material is disposed.

Since silicon nitride (SiNx) has an excellent capturing ability for a hydrogen particle as compared with silicon oxide (SiOx), deterioration of a reliability of the driving transistor 260 due to a hydrogen particle penetrating into an oxide semiconductor material may be prevented.

The first light shielding layer 208 may include a metallic material such as titanium (Ti) having an excellent capturing ability for a hydrogen particle. For example, the first light shielding layer 208 may have a single layer of titanium (Ti), a multiple layer of molybdenum (Mo) and titanium (Ti) or a single layer of an alloy of molybdenum (Mo) and titanium (Ti). In another embodiment, the first light shielding layer 208 may include another metallic material including titanium (Ti).

Titanium (Ti) may capture a hydrogen particle diffused in the upper buffer layer 210 to prevent a hydrogen particle from reaching the third active layer 211. When the first light shielding layer 208 of the driving transistor 260 is formed of a metallic material such as titanium (Ti) having a capturing ability for a hydrogen particle and is surrounded by silicon nitride (SiNx) having a capturing ability for a hydrogen particle, a reliability of a pattern of an oxide semiconductor material against a hydrogen particle is obtained.

Differently from the first upper sub-buffer layer 210a, the second upper sub-buffer layer 210b including silicon nitride (SiNx) is not disposed in the entire display area. Instead, the second upper sub-buffer layer 210b may be disposed on a portion of the first upper sub-buffer layer 210a to selectively cover the first light shielding layer 208. The second upper sub-buffer layer 210b may include a material such as silicon nitride (SiNx) different from a material of the first upper sub-buffer layer 210a. As a result, when the second upper sub-buffer layer 210b is disposed in the entire display area, the second upper sub-buffer layer 210b may be peeled off. To prevent the peeling, the second upper sub-buffer layer 210b may be selectively disposed on a portion where the first light shielding layer 208 is disposed. To explain, the first and second upper sub-buffer layers 210a and 210b include different insulating materials such as silicon oxide and silicon nitride. As a result, when the first and second upper sub-buffer layers 210a and 210b are formed to contact each other over the whole of the substrate 101, the second upper sub-buffer layer 210b may be peeled off due to a stress. In the present application, since the second upper sub-buffer layer 210b is formed on a portion of the first light shielding layer 208, the contact area between the first and second upper sub-buffer layers 210a and 210b is minimized which prevents peeling.

The first light shielding layer 208 and the second upper sub-buffer layer 210b may be disposed directly under the third active layer 211 to overlap the third active layer 211. The first light shielding layer 208 and the second upper sub-buffer layer 210b may have a size greater than a size of the third active layer 211 to completely overlap the third active layer 211.

The third source electrode 219S of the driving transistor 260 may be electrically connected to the first light shielding layer 208.

The storage capacitor 250 (Cs (of FIG. 4)) may store the data signal applied through the data line and may provide the data signal to the emitting element. The storage capacitor 250 may include two corresponding electrodes and a dielectric layer between the two electrodes. For example, the storage capacitor 250 may include a first capacitor electrode 205 having the same material and the same layer as the first gate electrode 206 and a second capacitor electrode 209 having the same material and the same layer as the first light shielding layer 208. The first interlayer insulating layer 207 and the first upper sub-buffer layer 210a may be disposed between the first capacitor electrode 205 and the second capacitor electrode 209. The first capacitor electrode 209 of the storage capacitor 250 may be electrically connected to the third source electrode 219S.

In an embodiment of FIG. 3, the storage capacitor 250 may be disposed at a side of the driving transistor 260. In another embodiment, the storage capacitor 250 may be disposed to be laminated with the driving transistor 260. When the storage capacitor 250 is laminated with the driving transistor 260, at least portion of the third source electrode 219S connected to the second capacitor electrode 209 may be omitted. For example, a fourth gate electrode may be further disposed on the third gate electrode 214 of the driving transistor 260. The third gate electrode 214 and the fourth gate electrode may be spaced apart from each other to constitute the storage capacitor 250.

A first planarizing layer 220 and a second planarizing layer 222 may be disposed on the driving element 270 to planarize the driving element 270. The first planarizing layer 220 and the second planarizing layer 222 may include an organic material such as polyimide and acrylic resin.

The emitting element 280 (De (of FIG. 4)) is disposed on the second planarizing layer 222. The emitting element 280 includes a first electrode 223 as an anode, a second electrode 227 as a cathode corresponding to the first electrode 223 and an emitting layer between the first electrode 223 and the second electrode 227. The first electrode 223 may be disposed in each subpixel.

The emitting element 280 may be connected to the driving element 270 through a connecting electrode 221 on the first planarizing layer 220. For example, the first electrode 223 of the emitting element 280 and the third drain electrode 219D of the driving transistor 260 of the driving element 270 may be connected to each other through the connecting electrode 221.

The first electrode 223 may contact the connecting electrode 221 exposed through a first contact hole CH1 in the second planarizing layer 222. The connecting electrode 221 may contact the third drain electrode 219D exposed through a second contact hole CH2 in the first planarizing layer 220.

The first electrode 223 may have a multiple layer including a transparent conductive material and an opaque conductive material having a relatively high reflectance. For example, the first electrode 223 may have a single layer or a multiple layer including a transparent conductive material having a relatively high work function such as indium tin oxide (ITO) or indium zinc oxide (IZO) and an opaque conductive material such as aluminum (Al), silver (Ag), copper (Cu), lead (Pb), molybdenum (Mo), titanium (Ti) and an alloy thereof. For example, the first electrode 223 may have a structure where a transparent conductive layer, an opaque conductive layer and a transparent conductive layer are sequentially laminated or a structure where a transparent conductive layer and an opaque conductive layer are sequentially laminated.

The emitting layer 225 may include a hole assisting layer, an emitting material layer and an electron assisting layer sequentially on the first electrode 223 or an electron assisting layer, an emitting material layer and a hole assisting layer sequentially on the first electrode 223. A bank layer 224 may expose the first electrode 223 of each subpixel and may be referred to as a pixel defining layer. The bank layer 224 may include an opaque material, for example, a black organic material to prevent an optical interference between the adjacent subpixels. For example, the bank layer 224 may include a light shielding material of at least one of a color pigment, an organic black and a carbon. A spacer 226 may be disposed on the bank layer 224.

The second electrode 227 of a cathode is disposed on a top surface and a side surface of the emitting layer 225 to face the first electrode 223 with the emitting layer 225 interposed therebetween. The second electrode 227 may be disposed in the entire display area as one body. When the organic light emitting diode display device has a top emission type, the second electrode 227 may include a transparent conductive material such as indium tin oxide (ITO) or indium zinc oxide (IZO).

An encapsulating element 228 for preventing penetration of a moisture may be further disposed on the second electrode 227. The encapsulating element 228 may include a first inorganic encapsulating layer 228a, a second organic encapsulating layer 228b, and a third inorganic encapsulating layer 228c sequentially laminated.

The first inorganic encapsulating layer 228a and the third inorganic encapsulating layer 228c of the encapsulating element 228 may include an inorganic material such as silicon oxide (SiOx). The second organic encapsulating layer 228b of the encapsulating element 228 may include an organic material such as acrylic resin, epoxy resin, phenolic resin, polyamide resin and polyimide resin.

In FIG. 4, each of red, green and blue subpixels SPr, SPg and SPb (SP) of the display panel 140 of the display device 110 according to an embodiment of the present disclosure includes first to seventh transistors T1 to T7, a storage capacitor Cs and a light emitting diode De. At least one of the first to seventh transistors T1 to T7 may be an oxide semiconductor thin film transistor, and the others of the first to seventh transistors T1 to T7 may be low temperature polycrystalline silicon thin film transistor.

For example, the first, second, fifth, sixth and seventh transistors T1, T2, T5, T6 and T7 may be a positive (P) type low temperature polycrystalline silicon thin film transistor, and the third and fourth transistors T3 and T4 may be a negative (N) type oxide semiconductor thin film transistor.

Alternatively, the second, fifth, sixth and seventh transistors T2, T5, T6 and T7 may be a low temperature polycrystalline silicon thin film transistor, and the first, third and fourth transistors T1, T3 and T4 may be an oxide semiconductor thin film transistor.

The first transistor T1 of a driving transistor is switched according to a voltage of the first capacitor electrode 205 of the storage capacitor Cs. A gate electrode of the first transistor T1 is connected to the first capacitor electrode 205 of the storage capacitor Cs, a drain electrode of the third transistor T3 and a drain electrode of the fourth transistor T4, a source electrode of the first transistor T1 is connected to a source electrode of the second transistor T2 and a drain electrode of the fifth transistor T5, and a drain electrode of the first transistor T1 is connected to a source electrode of the third transistor T3 and a source electrode of the sixth transistor T6.

The second transistor T2 of a switching transistor is switched according to an nth gate2 signal Sc2(n). A gate electrode of the second transistor T2 is connected to the nth gate2 signal Sc2(n), a source electrode of the second transistor T2 is connected to a source electrode of the first transistor T1 and a drain electrode of the fifth transistor T5, and a drain electrode of the second transistor T2 is connected to the data signal Vdata.

The third transistor T3 of a sensing transistor is switched according to an nth gate1 signal Sc1(n). A gate electrode of the third transistor T3 is connected to the nth gate1 signal Sc1(n), a source electrode of the third transistor T3 is connected to a drain electrode of the first transistor T1 and a source electrode of the sixth transistor T6, and a drain electrode of the third transistor T3 is connected to a gate electrode of the first transistor T1, a first capacitor electrode 205 of the storage capacitor 205 and a drain electrode of the fourth transistor T4.

The fourth transistor T4 is switched according to an (n−1)th gate1 signal Sc1(n−1). A gate electrode of the fourth transistor T4 is connected to the (n−1)th gate1 signal Sc1(n−1), a source electrode of the fourth transistor T4 is connected to an initialization voltage line that supplies an initial voltage Vini, and a drain electrode of the fourth transistor T4 is connected to a gate electrode of the first transistor T1, a first capacitor electrode 205 of the storage capacitor Cs and a drain electrode of the third transistor T3.

The fifth transistor T5 is switched according to an nth emission signal Em(n). A gate electrode of the fifth transistor T5 is connected to the nth emission signal Em(n), a source electrode of the fifth transistor T5 is connected to a high voltage line that supplies a high level voltage Vdd (e.g., a high potential voltage) and the second capacitor electrode 209 of the storage capacitor Cs, and a drain electrode of the fifth transistor T5 is connected to a source electrode of the first transistor T1 and a source electrode of the second transistor T2.

The sixth transistor T6 of an emission transistor is switched according to an nth emission signal Em(n). A gate electrode of the sixth transistor T6 is connected to the nth emission signal Em(n), a source electrode of the sixth transistor T6 is connected to a drain electrode of the first transistor T1 and a source electrode of the third transistor T3, and a drain electrode of the sixth transistor T6 is connected to an anode of the light emitting diode De and a source electrode of the seventh T7.

The seventh transistor T7 is switched according to an nth gate2 signal Sc2(n). A gate electrode of the seventh transistor T7 is connected to the nth gate2 signal Sc2(n), a source electrode of the seventh transistor T7 is connected to a drain electrode of the sixth transistor T6 and an anode of the light emitting diode De, and a drain electrode of the seventh transistor T7 is connected to an anode reset voltage Var.

The storage capacitor Cs stores the data signal Vdata and the threshold voltage Vth. A first capacitor electrode 205 of the storage capacitor Cs is connected to the gate electrode of the first transistor T1 and the drain electrode of the fourth transistor T4, and a second capacitor electrode 209 of the storage capacitor Cs is connected to the high level voltage Vdd and the source electrode of the fifth transistor T5.

The light emitting diode De is connected between the sixth and seventh transistors T6 and T7 and the low level voltage Vss (e.g., a low potential voltage) to emit a light of a luminance proportional to a current of the first transistor T1. An anode of the light emitting diode De is connected to the drain electrode of the sixth transistor T6 and the source electrode of the seventh transistor T7, and a cathode of the light emitting diode De is connected to a low level voltage line that supplies the low level voltage Vss. The high level voltage Vdd and the low level voltage Vss can be referred to as high level and low level voltage lines respectively.

The source electrode of the first transistor T1, the source electrode of the second transistor T2 and the drain electrode of the fifth transistor T5 constitute a first node N1, and the gate electrode of the first transistor T1, the drain electrode of the third transistor T3, the first capacitor electrode 205 of the storage capacitor Cs and the drain electrode of the fourth transistor T4 constitute a second node N2. In one embodiment, the drain electrode of the first transistor T1, the source electrode of the third transistor T3, and the source electrode of the sixth transistor constitute a third node N3.

In FIG. 5, the first gate driving unit 130 of the display device 110 according to an embodiment of the present disclosure includes a gate1 signal block Bsc1, an odd gate2 signal block Bsc2o, and an even gate2 signal block Bsc2e, and the second gate driving unit 135 of the display device 110 according to an embodiment of the present disclosure includes an emission signal block Bem, an odd gate2 signal block Bsc2o and an even gate2 signal block Bsc2e. The display panel 140 includes a pixel area PA and a link area LA.

The gate1 signal block Bsc1, the odd gate2 signal block Bsc2o and the even gate2 signal block Bsc2e at one side of the pixel area PA may be one stage of a shift register, and the emission signal block Bem, the odd gate2 signal block Bsc2o and the even gate2 signal block Bsc2e at an opposite side of the pixel area PA may be one stage of a shift register. The shift register may include a plurality of stages connected to each other by a cascade type.

Figure 6:
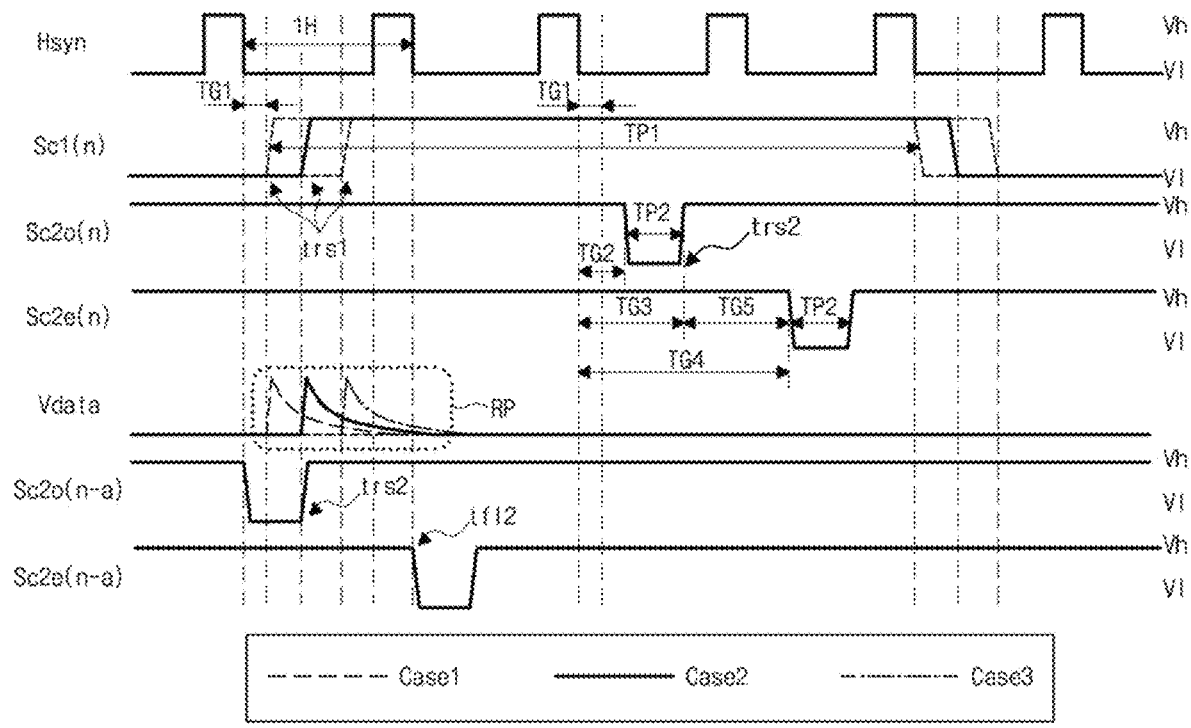
FIG. 6 is a view showing a plurality of signals of a display device according to an embodiment of the present disclosure.

In the first gate driving unit 130, the gate1 signal block Bsc1 generates a gate1 signal Sc1(n) and Sc1(n−a) (of FIG. 6), the odd gate2 signal block Bsc2o generates an odd gate2 signal Sc2o(n) (of FIG. 6), and the even gate2 signal block Bsc2e generates the even gate2 signal Sc2e(n) (of FIG. 6).

In the second gate driving unit 135, the emission signal block Bem generates an emission signal Em(n) (of FIG. 6), the odd gate2 signal block Bsc2o generates an odd gate2 signal Sc2o(n) (of FIG. 6), and the even gate2 signal block Bsc2e generates the even gate2 signal Sc2e(n) (of FIG. 6).

The gate1 signal Sc1(n) and Sc1(n–a) of the gate1 signal block Bsc1 is supplied to odd and even pixel lines of the pixel area PA through the link area PA. The odd gate2 signal Sc2o(n) of the odd gate2 signal block Bsc2o is supplied to the odd pixel line through the link area LA, and the even gate2 signal Sc2e(n) of the even gate2 signal block Bsc2e is supplied to the even pixel line of the pixel area PA through the link line LA.

The even pixel line may be a row of pixels arranged in even order (e.g., an even numbered pixel line) from a top portion of the display panel 140, and the odd pixel line may be a row of pixels arranged in odd order (e.g., an odd numbered pixel line) from the top portion of the display panel 140.

In another embodiment, the first and second driving units 130 and 135 may be symmetrically constituted with respect to each other. For example, each of the first and second gate driving units 130 and 135 may include the gate1 signal block Bsc1, the odd gate2 signal block Bsc2o, the even gate2 signal block Bsc2e and the emission block Bem.

Driving the display panel 140 of the display device 110 by adjusting a rising timing of the gate1 signal will be illustrated with reference to drawings. In one embodiment, the rising timing is when the gate1 signal begins to rise from the logic low level V1 to the logic high level Vh.

Figure 7:
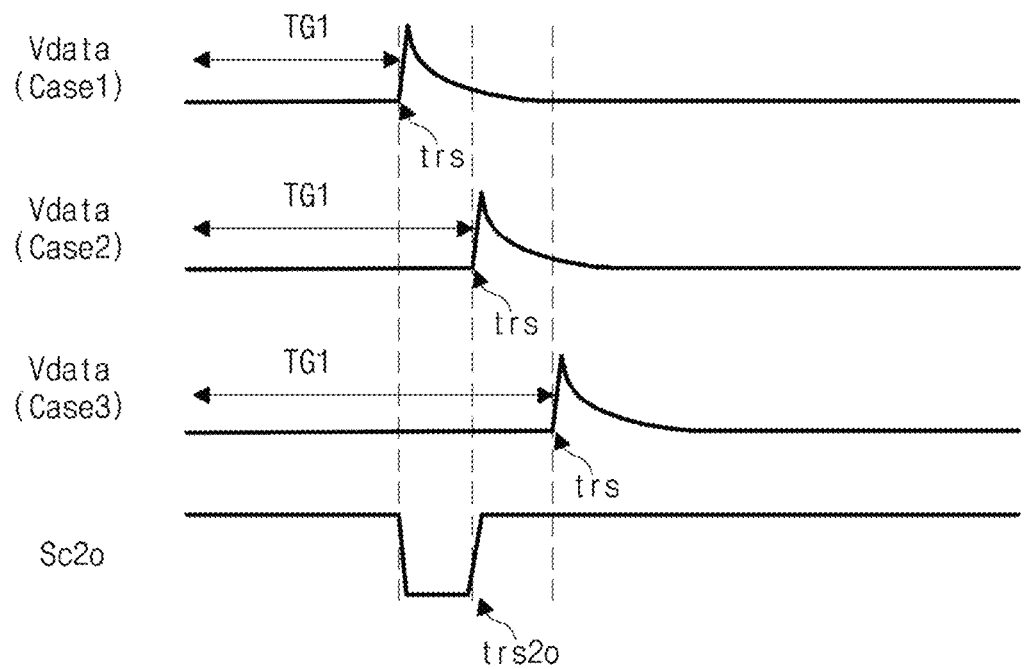
FIG. 7 is a view showing a view showing a data signal and a gate2 signal of a display device according to an embodiment of the present disclosure.

FIG. 6 is a view showing a plurality of signals of a display device according to an embodiment of the present disclosure, and FIG. 7 is a view showing a view showing a data signal and a gate2 signal of a display device according to an embodiment of the present disclosure.

In FIGS. 6 and 7, a horizontal synchronization signal Hsyn outputted from the timing controlling unit 120 is a reference of a timing of the data signal Vdata to one pixel line of the display panel 140. During an interval from a falling timing of one pulse where the horizontal synchronization signal Hsyn is changed from a logic high voltage Vh (e.g., a second level) to a logic low voltage V1 (e.g., a first level) to a falling timing of a next pulse, the data signal Vdata is supplied to one pixel line. The pulse of the horizontal synchronization signal Hsyn may be repeated by one horizontal period (1H).

The nth gate1 signal Sc1(n) outputted from the gate1 signal block Bsc1 switches the third and fourth transistors T3 and T4 of each subpixel SPr, SPg and SPb of the odd and even pixel lines. During a first period TP1 of an initialization period where the nth gate1 signal Sc1(n) and the (n–1)th gate1 signal Sc1(n–1) have a logic high voltage Vh, the third and fourth transistors T3 and T4 are turned on such that the initial voltage Vini is applied to the gate electrode and the drain electrode of the first transistor T1. As a result, the gate electrode and the drain electrode of the first transistor T1 is initialized.

The nth odd gate2 signal Sc2o(n) and the nth even gate2 signal Sc2e(n) outputted from the odd and even gate2 signal blocks Bsc2o and Bsc2e switch the second and seventh transistors T2 and T7 of each subpixel SPr, SPg and SPb of the odd and even pixel lines, respectively. During a second period TP2 of a sampling period where the nth odd gate2 signal Sc2o (n) and the nth even gate2 signal Sc2e(n) have a logic low voltage V1, the second and seventh transistors T2 and T7 are turned on such that the data signal Vdata is applied to the source electrode of the first transistor T1 and the anode reset voltage Var is applied to the anode of the light emitting diode De via an anode reset voltage line. As a result, the threshold voltage Vth of the first transistor T1 is stored in the storage capacitor Cs and the anode of the light emitting diode De is reset.

The nth emission signal Em(n) outputted from the emission signal blocks Bem switches the fifth and sixth transistors T5 and T6 of each subpixel SPr, SPg and SPb. During a third period TP3 (not shown) of an emission period where the nth emission signal Em(n) has a logic low voltage V1, the fifth and sixth transistors T5 and T6 are turned on such that the high level voltage Vdd is applied to the source electrode of the first transistor T1 and the current of the first transistor T1 is transmitted to the light emitting diode De. As a result, the light emitting diode De emits a light corresponding to the data signal Vdata.

In the display device 110 according to an embodiment of the present disclosure, since the plurality of horizontal link lines HL are disposed in the display area DA, a parasitic capacitor is formed between the plurality of horizontal link lines HL transmitting the data signal Vdata and the gate line GL transmitting the gate1 signal Sc1, and a coupling is generated between the data signal Vdata and the gate1 signal Sc1.

At a rising timing trs where the nth gate1 signal Sc1(n) corresponding to the nth odd pixel line and the nth even pixel line is changed from the logic low voltage V1 to the logic high voltage Vh, a ripple RP is caused in the data signal Vdata due to the coupling between the horizontal link line HL and the gate line GL.

When an (n–a)th odd gate2 signal Sc2o(n–a) corresponding to an (n–a)th odd pixel line (an odd pixel line previous by a to the nth odd pixel line) has a state of a logic low voltage, a sampling is performed before the data signal Vdata is saturated and stabilized. As a result, the data signal Vdata stored in the storage capacitor Cs is distorted, and deterioration such as a slanted line crosstalk along a diagonal direction is caused in the display area DA adjacent to the data driving unit 125 of the display panel 140 due to the distortion of the data signal Vdata.

A first rising timing trs1 of the nth gate1 signal Sc1(n) has a first time gap TG1 from a falling timing of a nearest pulse of the horizontal synchronization signal Hsyn, and a falling timing of the nth odd gate2 signal Sc2o(n) has a second time gap TG2 from a falling timing of a nearest pulse of the horizontal synchronization signal Hsyn. A second rising timing trs2 of the nth odd gate2 signal Sc2o(n) has a third time gap TG3 from a falling timing of a nearest pulse of the horizontal synchronization signal Hsyn, and a falling timing of the nth even gate2 signal Sc2e(n) has a fourth time gap TG4 from a falling timing of a nearest pulse of the horizontal synchronization signal Hsyn.

When the first rising timing trs1 of the nth gate1 signal Sc1(n) is prior to (before) the second rising timing trs2 of the (n–a)th odd gate2 signal Sc2o(n–a) (Case1) (the first time gap TG1 is smaller than the third time gap TG3 (TG1<TG3)), the ripple RP is generated in the data signal Vdata due to a voltage change at the first rising timing trs1 of the nth gate1 signal Sc1(n). Since a sampling is performed to the data signal Vdata of the (n–a)th odd pixel line according to a state of the logic low voltage V1 of the (n–a)th odd gate2 signal Sc2o(n–a) before the data signal Vdata is saturated to be stabilized, the data signal Vdata stored in the storage capacitor Cs is distorted to cause deterioration such as a slanted line crosstalk along a diagonal direction.

In the display device 110 according to an embodiment of the present disclosure, the first rising timing trs1 of the nth gate1 signal Sc1(n) is determined to be simultaneous with the second rising timing trs2 of the (n−a)th odd gate2 signal Sc2o(n−a) (Case2) (the first time gap TG1 is simultaneous with the third time gap TG3 (TG1=TG3)) or to be next to (after) the second rising timing trs2 of the (n−a)th odd gate2 signal Sc2o(n−a) (Case3) (the first time gap TG1 is greater than the third time gap TG3 (TG1>TG3)). That is, a rising timing of the gate1 signal during which the gate1 signal rises from a low level to high level occurs while a rising timing of the odd gate2 signal during which the odd gate2 signal rises from the low level to the high level occurs (e.g., Case2) or the rising timing of the gate1 signal occurs after the rising timing of the odd gate2 signal (e.g., Case3). In other words, a rising timing of the gate1 signal applied to a first pixel line during which the gate1 signal rises from a low level to a high level occurs at least while a rising timing of an odd gate2 signal applied to a second pixel line that is arranged prior to the first pixel line during which the odd gate2 signal rises from the low level to the high level but not prior to the odd gate2 signal applied to the second pixel rising from the first level to the second level Although the ripple is generated in the data signal Vdata due to the voltage change at the first rising timing trs1 of the nth gate1 signal Sc1(n), a sampling of the data signal Vdata of the (n−a)th odd pixel line is performed according to the logic low voltage V1 of the (n−a)th odd gate2 signal Sc2o(n−a) in a state where the data signal Vdata before the ripple RP is saturated to be stabilized. As a result, distortion of the data signal Vdata stored in the storage capacitor Cs is reduced or minimized and deterioration such as a slanted line crosstalk along a diagonal direction is prevented.

In the display device 110 according to an embodiment of the present disclosure, since the first rising timing trs1 of the nth gate1 signal Sc1(n) is determined to be simultaneous with or next to (after) the second rising timing trs2 of the (n−a)th odd gate2 signal Sc2o(n−a) (Case3) (the first time gap TG1 is equal to or greater than the third time gap TG3 (TG1>TG3)), the sampling to the data signal Vdata of the (n−a)th odd pixel line is performed before the ripple RP of the data signal Vdata. That is, the ripple RP of the data signal Vdata occurs while the odd gate2 signal Sc2o(n−a) is at the logic high level Vh but not while the odd gate2 signal Sc2o(n−a) is at the logic low level V1. As a result, the distortion of the data signal Vdata stored in the storage capacitor Cs is reduced or minimized and deterioration such as a slanted line crosstalk along a diagonal direction is prevented.

The rising timing of each of the gate1 signal and the odd gate2 signal may be classified into a rising start timing and a rising end timing. The rising start timing of the gate1 signal may be simultaneous with the rising end timing of the odd gate2 signal. That is, the gate1 signal applied begins to rise as the odd gate2 signal stops rising. For example, the first rising timing trs1 may be classified into a first rising start timing and a first rising end timing, and an interval between the first rising start timing and the first rising end timing may be defined as a first rising time (or a first rising slew) (first rising end timing=first rising start timing+first rising time). The second rising timing trs2 may be classified into a second rising start timing and a second rising end timing, and an interval between the second rising start timing and the second rising end timing may be defined as a second rising time (or a second rising slew) (second rising end timing=second rising start timing+second rising time). The first rising start timing of the nth gate1 signal may be determined to be simultaneous with the second rising end timing of the (n−a)th odd gate2 signal Sc2o(n−a). That is, the first time gap TG1 may be determined to be a sum of the third time gap TG3 and the second rising time (TG1=TG3+second rising time). Since the sampling of the data signal Vdata of the (n−a)th pixel line is completed before the ripple of the data signal Vdata, distortion of the data signal Vdata stored in the storage capacitor Cs is reduced or minimized and deterioration such as a slanted line crosstalk along a diagonal direction is prevented.

When the first rising timing trs1 of the nth gate1 signal Sc1(n) is excessively delayed compared to the second rising timing trs2 of the (n−a)th odd gate2 signal Sc2o(n−a) (the first time gap TG1 is excessively greater than the third time gap TG3 (TG1>>TG3)), the first rising timing trs1 of the nth gate1 signal Sc1(n) overlaps the state of the logic low voltage V1 of the (n−a)th even gate2 signal Sc2e(n−a). As a result, during the sampling to the (n−a)th even pixel line, the data signal Vdata stored in the storage capacitor Cs may be distorted due to the ripple RP of the data signal Vdata to cause deterioration such as a slanted line crosstalk along a diagonal direction.

In the display device 110 according to an embodiment of the present disclosure, since the first rising timing trs1 of the nth gate1 signal Sc1(n) is determined to be previous to (before) the second falling timing tfl2 of the (n−a)th even gate2 signal Sc2e(n−a) (the first time gap TG1 is smaller than the fourth time gap TG4 (TG1<TG4)), the sampling to the data signal Vdata of the (n−a)th even pixel line is performed after the ripple RP of the data signal Vdata. As a result, distortion of the data signal Vdata stored in the storage capacitor Cs is reduced or minimized and deterioration such as a slanted line crosstalk along a diagonal direction is prevented.

For example, distortion of the data signal Vdata may be reduced or minimized and deterioration such as a slanted line crosstalk along a diagonal direction may be prevented by determining the first rising timing trs1 of the nth gate1 signal Sc1(n) to be prior to (before) a timing corresponding to a sum of the third time gap TG3 and a fraction (e.g., 1/10) of a fifth time gap TG5 (=TG4-TG3) between the second rising timing trs2 of the (n−a)th odd gate2 signal Sc2o(n−a) and the second falling timing tfl2 of the (n−a)th even gate2 signal Sc2e(n−a) (determining the first time gap TG1 to be smaller than a sum of the third time gap TG3 and the fraction (e.g., 1/10) of the fifth time gap TG5 (TG1<(TG3+(1/10)*TG5), TG1<(TG3+(1/10)*(TG4-TG3)).

An effect of preventing a slanted line crosstalk along a diagonal line will be illustrated with reference to a drawing.

Figure 8:
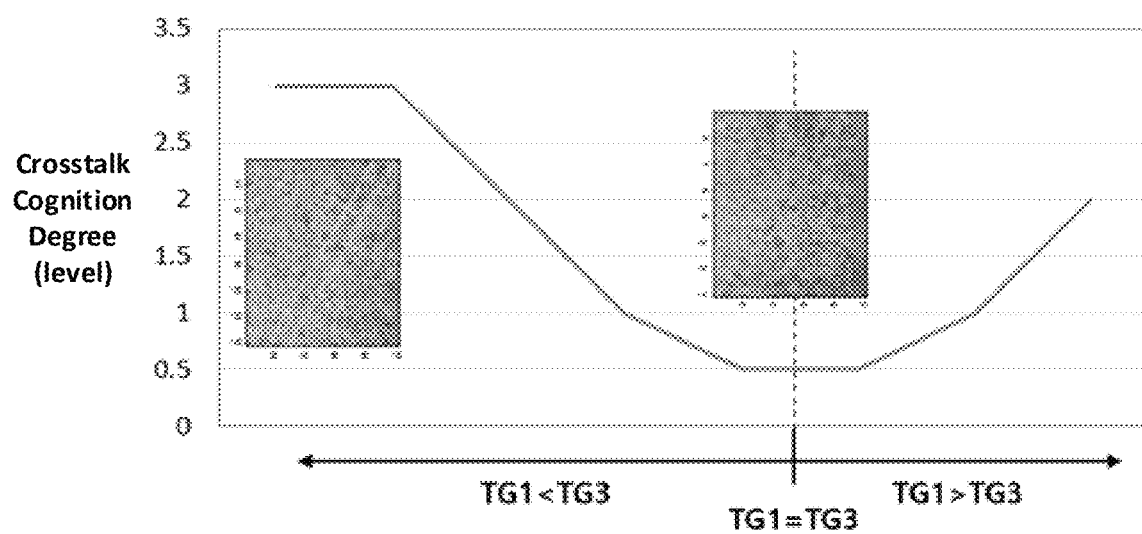
FIG. 8 is a view showing a crosstalk cognition degree with respect to a first time gap of a display device according to an embodiment of the present disclosure.

FIG. 8 is a view showing a crosstalk cognition degree with respect to a first time gap of a display device according to an embodiment of the present disclosure.

In FIG. 8, for a section (TG1<TG3) where the first time gap TG1 from the falling timing of the nearest pulse of the horizontal synchronization signal Hsyn to the first rising timing trs1 of the nth gate1 signal Sc1(n) is less than the third time gap TG3 from the falling timing of the nearest pulse of the horizontal synchronization signal Hsyn to the second rising timing trs2 of the nth odd gate2 signal Sc2o(n), a crosstalk cognition degree decreases as the first time gap TG1 increases. When the first time gap TG1 is equal to the third time gap TG3, the crosstalk cognition degree has a minimum value. For a section (TG1>TG3) where the first time gap TG1 is greater than the third time gap TG3, the crosstalk cognition degree increases as the first time gap TG1 increases.

While a luminance difference between the slanted line crosstalk and a periphery under a condition where the slanted line crosstalk is deteriorated (for example, TG1<<TG3) is about 7.6%, a luminance difference between the slanted line crosstalk and a periphery under a condition where the slanted line crosstalk is optimized (for example, TG1=TG3) is about 2.4% (acceptable reference value level). As a result, the slanted line crosstalk along a diagonal direction is reduced or minimized.

Since the first rising timing trs1 of the nth gate1 signal Sc1($n$) is determined to be simultaneous with or next to (after) the second rising timing trs2 of the (n-a)th odd gate2 signal Sc2$o$(n-a) and to be prior to (before) the second falling timing tfl2 of the (n-a)th even gate2 signal Sc2$e$(n-a) (the first time gap TG1 is determined to be equal to or greater than the third time gap TG3 and to be smaller than the fourth time gap TG4 (TG3≤TG1<TG4)), the sampling to the data signal Vdata of the (n-a)th odd pixel line and the (n-a)th even pixel line is performed before occurrence of the ripple RP and after extinction of the ripple RP. As a result, distortion of the data signal Vdata stored in the storage capacitor Cs is reduced or minimized and deterioration such as a slanted line crosstalk along a diagonal direction is prevented.

Consequently, in the display device 110 according to an embodiment of the present disclosure, since a timing of a plurality of gate signals is adjusted, a slanted line crosstalk along a diagonal direction in a display panel where a link line is disposed in a display area is reduced or minimized.

Since a sampling is performed after a data signal is saturated, distortion of a data signal and a slanted line crosstalk along a diagonal direction are reduced or minimized and a display quality of an image is improved.

It will be apparent to those skilled in the art that various modifications and variation can be made in the present disclosure without departing from the scope of the disclosure. Thus, it is intended that the present disclosure cover the modifications and variations of this disclosure provided they come within the scope of the appended claims.

Also disclosed herein:

1. A display device, comprising:
   a timing controlling circuit configured to generate image data, a data control signal, and a gate control signal;
   a data driving circuit configured to generate a data signal using the image data and the data control signal;
   a gate driving circuit configured to generate a gate1 signal, an odd gate2 signal, an even gate2 signal, and an emission signal using the gate control signal; and
   a display panel displaying an image using the gate1 signal, the odd gate2 signal, the even gate2 signal, and the emission signal,
   wherein a rising timing of the gate1 signal during which the gate1 signal rises from a low level to high level occurs while a rising timing of the odd gate2 signal during which the odd gate2 signal rises from the low level to the high level occurs or the rising timing of the gate1 signal occurs after the rising timing of the odd gate2 signal.
2. The display device of claim 1, wherein the rising timing of the gate1 signal and the rising timing of the odd gate2 signal each include a rising start timing and a rising end timing, and the rising start timing of the gate1 signal occurs while the rising end timing of the odd gate2 signal occurs.
3. The display device of claim 1, wherein the rising timing of the gate1 signal occurs prior to a falling timing of the even gate2 signal during which the even gate2 signal decreases from the high level to the low level.
4. The display device of claim 1, wherein the gate1 signal includes an nth gate1 signal, the odd gate2 signal includes an nth odd gate2 signal and an (n-a)th odd gate2 signal, and the even gate2 signal includes an nth even gate2 signal and an (n-a)th even gate2 signal, and
   wherein a first time gap from a falling timing of a nearest pulse of a horizontal synchronization signal from the high level to the low level to a rising timing of the nth gate1 signal from the low level to the high level is equal to or greater than a third time gap from a falling timing of the nearest pulse of the horizontal synchronization signal to a rising timing of the (n-a)th odd gate2 signal from the low level to the high level and less than a fourth time gap from the falling timing of the nearest pulse of the horizontal synchronization signal to a falling timing of the (n-a)th even gate2 signal from the high level to the low level.
5. The display device of claim 4, wherein the first time gap is less than a sum of the third time gap and 1/10 of a fifth time gap from the rising timing of the (n-a)th odd gate2 signal to the falling timing of the (n-a)th even gate2 signal.
6. The display device of claim 1, wherein the display panel includes an odd pixel line and an even pixel line, and the gate1 signal is supplied to the odd pixel line and the even pixel line, the odd gate2 signal is supplied to the odd pixel line, and the even gate2 signal is supplied to the even pixel line.
7. The display device of claim 1, wherein the gate driving circuit includes a first gate driving circuit in a first side portion of the display panel and a second gate driving circuit in a second side portion of the display panel,
   wherein the first gate driving circuit includes a gate1 signal block configured to generate the gate1 signal, a first odd gate2 signal block configured to generate the odd gate2 signal, and a first even gate2 signal block configured to generate the even gate2 signal, and
   wherein the second gate driving circuit includes an emission signal block configured to generate the emission signal, a second odd gate2 signal block configured to generate the odd gate2 signal, and a second even gate2 signal block configured to generate the even gate2 signal.
8. The display device of claim 1, wherein the display panel includes a display area at a central portion of the display panel and a non-display area surrounding the display area,
   wherein a plurality of pixels, a plurality of gate lines, a plurality of data lines, a plurality of vertical link lines, and a plurality of horizontal link lines are in the display area, and
   wherein the plurality of data lines and the plurality of vertical link lines are connected to the data driving circuit, and the plurality of horizontal link lines connect the plurality of vertical link lines and the plurality of data lines.
9. The display device of claim 1, wherein the display panel includes a plurality of subpixels, each of the plurality of subpixels comprises:
   a storage capacitor connected to a high voltage line that supplies a high level voltage, the storage capacitor including a first capacitor electrode and a second capacitor electrode;
   a first transistor switched according to a voltage of the first capacitor electrode of the storage capacitor;

a second transistor switched according to the even gate2 signal or the odd gate 2 signal, the second transistor connected to a data line that supplies the data signal and the first transistor;

a third transistor switched according to the gate1 signal, the third transistor connected to the second capacitor electrode of the storage capacitor and the first transistor;

a fourth transistor switched according to the gate1 signal, the fourth transistor connected to the second capacitor electrode of the storage capacitor and an initialization voltage line that supplies an initial voltage;

a fifth transistor switched according to the emission signal, the fifth transistor and connected to the high voltage line and the first transistor;

a sixth transistor switched according to the emission signal, the sixth transistor connected to the first transistor;

a seventh transistor switched according to the odd gate2 signal or the even gate2 signal, the seventh transistor connected to an anode reset voltage line that supplies an anode reset voltage and the sixth transistor; and a light emitting diode connected between the sixth transistor and a low level voltage line that supplies a low level voltage.

10. The display device of claim 9, wherein at least one of the first transistor to the seventh transistor is an oxide semiconductor thin film transistor.

11. A display device comprising:
a display panel including a plurality of pixel lines arranged in even pixel lines and odd pixel lines, a plurality of gate lines connected to a plurality of pixels included in the plurality of pixel lines, and a plurality of data lines connected to the plurality of pixels;
a data driving circuit configured to provide a data signal corresponding to image data to the plurality of data lines;
a gate driving circuit configured to generate a first gate signal that is applied to the even pixel lines and the odd pixel lines and an odd gate signal that is applied to the odd pixel lines but not the even pixel lines,
wherein the first gate signal is applied to a first pixel line from the plurality of pixel lines and rises from a first level to a second level while the odd gate signal that is applied to an odd pixel line that is arranged prior to the first pixel line rises from the first level to the second level or the first gate signal rises from the first level to the second level after the odd gate signal rises from the first level to the second level.

12. The display device of claim 11, wherein the odd gate signal applied to the odd pixel line rises from the first level to the second level after falling from the second level to the first level.

13. The display device of claim 11, wherein the first gate signal applied to the first pixel line begins to rise as the odd gate signal applied to the odd pixel line stops rising.

14. The display device of claim 11, wherein the gate driving circuit is further configured to generate an even gate signal that is applied to the even pixel lines but is not applied to the odd pixel lines, the first gate signal rising from the first level to the second level before the even gate signal that is applied to an even pixel line that is arranged prior to the first pixel line falls from the second level to the first level.

15. The display device of claim 14, wherein a first time gap from a timing of a horizontal synchronization signal falling from the second level to the first level to a timing of the first gate signal rising from the first level to the second level is equal to or greater than a second time gap from the timing of the horizontal synchronization signal falling from the second level to the first level to a timing of the odd gate signal rising from the first level to the second level and the first time gap is less than a third time gap from the horizontal synchronization signal falling from the second level to the first level to a timing of the even gate signal falling from the second level to the first level.

16. The display device of claim 15, wherein the first time gap is less than a sum of the second time gap and a fraction of a fourth time gap from the timing of the odd gate signal rising from the first level to the second level to the timing of the even gate signal falling from the second level to the first level.

17. The display device of claim 14, wherein the gate driving circuit is further configured to generate an emission signal applied to the even pixel lines and the odd pixel lines, and the gate driving circuit comprises:
a first gate driving circuit at a first side of the display panel; and
a second gate driving circuit at a second side of the display panel that is opposite the first side,
wherein the first gate driving circuit is configured to generate the first gate signal, the odd gate signal, and the even gate signal, and the second gate driving circuit is configured to generate the emission signal, the odd gate signal, and the even gate signal.

18. The display device of claim 11, wherein the display panel further comprises:
a plurality of vertical link lines that extend in a same direction as the plurality of data lines;
a plurality of horizontal link lines that extend in a same direction as the plurality of gate lines,
wherein the plurality of data lines and the plurality of vertical link lines are connected to the data driving circuit, and the plurality of horizontal link lines connect together the plurality of vertical link lines and the plurality of data lines.

19. The display device of claim 14, wherein each pixel included in the plurality of pixel lines comprises a plurality of subpixels, each subpixel including:
a first transistor including a first electrode of the first transistor connected to a first node, a gate electrode of the first transistor connected to a second node, and a second electrode of the first transistor that is connected to a third node;
a second transistor including a first electrode of the second transistor that is connected to a data line from the plurality of data lines that supplies the data signal to the second transistor, a second electrode of the second transistor that is connected to the first electrode of the first transistor at the first node, and a gate electrode of the second transistor that receives either odd gate signal or the even gate signal depending on whether the subpixel is included in an odd pixel line or an even pixel line;
a third transistor including a first electrode of the third transistor that is connected to the first electrode of the first transistor at the second node, a second electrode of the third transistor that is connected to the second electrode of the first transistor at the third node, and a gate electrode of the third transistor that receives the first gate signal;

a fourth transistor including a first electrode connected to the gate electrode of the first transistor and the first electrode of the third transistor at the second node, a second electrode of the fourth transistor that receives an initialization voltage, and a gate electrode of the fourth transistor that receives a first gate signal applied to a pixel line that is arranged prior to a pixel line that includes the subpixel;

a fifth transistor including a first electrode of the fifth transistor that receives a high potential voltage, a second electrode of the fifth transistor that is connected to the first electrode of the first transistor and the second electrode of the second transistor at the first node, and a gate electrode that receives an emission signal;

a sixth transistor including a first electrode connected to the second electrode of the first transistor and the second electrode of the third transistor at the third node, a second electrode of the sixth transistor, and a gate electrode of the sixth transistor that receives the emission signal;

a light emitting element including a first electrode connected to the second electrode of the sixth transistor and a second electrode that receives a low potential voltage;

a seventh transistor including a first electrode that is connected to the first electrode of the light emitting element and the second electrode of the sixth transistor, a second electrode that receives a reset voltage, and a gate electrode of the seventh transistor that is connected to the gate electrode of the second transistor; and a storage capacitor including a first electrode connected to the first electrode of the fifth transistor and connected to the first electrode of the fourth transistor, the first electrode of the third transistor, and the gate electrode of the first transistor at the second node.

20. The display device of claim 19, wherein at least one of the first transistor to the seventh transistor is an oxide semiconductor thin film transistor.

21. The display device of claim 11, wherein a ripple in the data signal occurs while the odd gate signal is at the second level but not while the odd gate signal is at the first level.

What is claimed is:

1. A display device, comprising:
a display panel including a plurality of subpixels;
a data driving unit arranged to supply a data signal to the plurality of subpixels;
a first gate driving unit arranged to supply a gate1 signal to the plurality of subpixels; and
a second gate driving unit arranged to supply an odd gate2 signal and an even gate2 signal to the plurality of subpixels,
wherein at least one of the plurality of subpixels comprises:
a storage capacitor connected to a high-level voltage line;
a driving transistor connected to the storage capacitor; and
a light emitting diode connected between the driving transistor and a low-level voltage line,
wherein a rising timing of the gate1 signal is not earlier than a rising timing of an odd gate2 signal.

2. The display device of claim 1, wherein the at least one of the plurality of subpixels further comprises:
a second transistor switched according to one of the odd gate2 signal and the even gate2 signal and connected to the data signal and the driving transistor;
a third transistor switched according to the gate1 signal and connected to the storage capacitor and the driving transistor;
a fourth transistor switched according to the gate1 signal and connected to the storage capacitor and an initial voltage;
a fifth transistor switched according to an emission signal and connected to the high-level voltage line and the driving transistor; and
a sixth transistor switched according to the emission signal and connected to the driving transistor.

3. The display device of claim 2, wherein the at least one of the plurality of subpixels further comprises a seventh transistor switched according to one of the odd gate2 signal and the even gate2 signal and connected to an anode reset voltage and the sixth transistor.

4. The display device of claim 2, wherein at least one of the driving transistor to the sixth transistor is an oxide semiconductor thin film transistor.

5. The display device of claim 1, wherein the first gate driving unit includes a gate1 signal block generating the gate1 signal.

6. The display device of claim 5, wherein the first gate driving unit further includes an odd gate2 signal block generating the odd gate2 signal and an even gate2 signal block generating the even gate2 signal.

7. The display device of claim 1, wherein the second gate driving unit includes an odd gate2 signal block generating the odd gate2 signal and an even gate2 signal block generating the even gate2 signal.

8. The display device of claim 7, wherein the second gate driving unit further includes an emission signal block generating an emission signal.

9. The display device of claim 1, wherein the display panel includes a pixel area and a link area,
wherein the gate1 signal is supplied to the pixel area through the link area, and
wherein the odd gate2 signal and the even gate2 signal are supplied to the pixel area through the link area.

10. The display device of claim 1, wherein the display panel includes a display area at a central portion thereof and a non-display area surrounding the display area,
wherein a plurality of data lines, a plurality of vertical link lines, and a plurality of horizontal link lines are disposed in the display area,
wherein the plurality of vertical link lines are parallel to and spaced apart from the plurality of data lines, and
wherein the plurality of horizontal link lines cross the plurality of data lines and are spaced apart from each other.

11. The display device of claim 10, wherein a portion of the plurality of data lines and a portion of the plurality of vertical link lines are connected to the data driving unit, and
wherein the plurality of horizontal link lines connect the portion of the plurality of vertical link lines and another portion of the plurality of data lines that are not connected to the data driving unit.

12. The display device of claim 1, wherein the rising timing of each of the gate1 signal and the odd gate2 signal is classified into a rising start timing and a rising end timing, and
wherein the rising start timing of the gate1 signal is simultaneous with the rising end timing of the odd gate2 signal.

13. The display device of claim 1, wherein the rising timing of the gate1 signal is previous to a falling timing of the even gate2 signal.

14. The display device of claim 1, wherein the display panel includes an odd pixel line and an even pixel line, and
  wherein at the rising timing of the odd gate2 signal or the even gate2 signal, a sampling to the data signal of the odd pixel line or the even pixel line is ended.

15. The display device of claim 14, wherein the sampling is performed after the data signal is saturated and stabilized.

16. The display device of claim 1, wherein the gate1 signal includes an nth gate1 signal, the odd gate2 signal includes an nth odd gate2 signal and an (n−a)th gate2 signal, and the even gate2 signal includes an nth even gate2 signal and an (n−a)th even gate2 signal, and
  wherein a first time gap from a falling timing of a nearest pulse of a horizontal synchronization signal to a rising timing of the nth gate1 signal is equal to or greater than a third time gap from a falling timing of the nearest pulse of the horizontal synchronization signal to a rising timing of a (n−a)th odd gate2 signal and smaller than a fourth time gap from the falling timing of the nearest pulse of the horizontal synchronization signal to a falling timing of the (n−a)th even gate2 signal.

17. The display device of claim 16, wherein the first time gap is smaller than a sum of the third time gap and $\frac{1}{10}$ of a fifth time gap from the rising timing of the (n−a)th odd gate2 signal to the falling timing of the (n−a)th even gate2 signal.

18. The display device of claim 1, wherein the display panel includes an odd pixel line and an even pixel line,
  wherein the gate1 signal is supplied to the odd pixel line and the even pixel line, and
  wherein the odd gate2 signal and the even gate2 signal are supplied to the odd pixel line and the even pixel line, respectively.

19. The display device of claim 1, further comprising a timing controlling unit arranged to generate image data, a data control signal and a gate control signal,
  wherein the data driving unit generates the data signal using the image data and the data control signal.

20. The display device of claim 1, wherein the first gate driving unit and the second gate driving unit are formed in a non-display area of a substrate of the display panel.

* * * * *